(12) United States Patent
Bringoltz et al.

(10) Patent No.: US 10,234,280 B2
(45) Date of Patent: Mar. 19, 2019

(54) REFLECTION SYMMETRIC SCATTEROMETRY OVERLAY TARGETS AND METHODS

(71) Applicant: KLA-Tencor Corporation, Milpitas, CA (US)

(72) Inventors: Barak Bringoltz, Rishon LeTzion (IL); Daniel Kandel, Aseret (IL)

(73) Assignee: KLA-Tencor Corporation, Milpitas, CA (US)

( * ) Notice: Subject to any disclaimer, the term of this patent is extended or adjusted under 35 U.S.C. 154(b) by 649 days.

(21) Appl. No.: 14/687,074

(22) Filed: Apr. 15, 2015

(65) Prior Publication Data

US 2015/0219449 A1    Aug. 6, 2015

Related U.S. Application Data

(63) Continuation of application No. PCT/US2014/048203, filed on Jul. 25, 2014.

(60) Provisional application No. 61/858,613, filed on Jul. 26, 2013.

(51) Int. Cl.
*G01B 11/27* (2006.01)
*G03F 7/20* (2006.01)

(52) U.S. Cl.
CPC ........ *G01B 11/272* (2013.01); *G03F 7/70633* (2013.01)

(58) Field of Classification Search
CPC .................................................. G01B 11/272
See application file for complete search history.

(56) References Cited

U.S. PATENT DOCUMENTS

| | | | |
|---|---|---|---|
| 4,757,207 A * | 7/1988 | Chappelow | G03F 7/70633 250/491.1 |
| 7,525,672 B1 | 4/2009 | Chen et al. | |
| 8,138,498 B2 * | 3/2012 | Ghinovker | G03F 7/70633 257/48 |

(Continued)

FOREIGN PATENT DOCUMENTS

WO    02/069390    *    9/2002    ............. H01L 21/66

*Primary Examiner* — Tri T Ton
*Assistant Examiner* — Rebecca C Bryant
(74) *Attorney, Agent, or Firm* — Suiter Swantz pc llo

(57) ABSTRACT

A method for target measurement is provided which comprises designing a reflection-symmetric target and measuring overlays of the target along at least one reflection symmetry direction of the target. Also, a tool calibration method comprising calibrating a scatterometry measurement tool with respect to a reflection symmetry of a reflection symmetric target. Further provided are methods of measuring scatterometry overlay using first order and zeroth order scatterometry measurements of a reflection-symmetric scatterometry targets. Also, a scatterometry target comprising a reflection-symmetric target having two cells in each of at least two measurement directions, wherein respective cells have different offsets along one measurement direction and similar offsets along other measurement directions. Further, a scatterometry measurement system comprising a reflection symmetric illumination and calibrated to measure reflection symmetric targets. Also, metrology tool comprising an illumination path and a collection path of the tool which are symmetric to reflection symmetries of a target.

17 Claims, 7 Drawing Sheets

(56) References Cited

U.S. PATENT DOCUMENTS

| | | |
|---|---|---|
| 2004/0137651 A1 | 7/2004 | Smedt et al. |
| 2004/0246482 A1 | 12/2004 | Sezginer et al. |
| 2005/0012928 A1 | 1/2005 | Sezginer et al. |
| 2012/0153281 A1 | 6/2012 | Ghinovker |

* cited by examiner

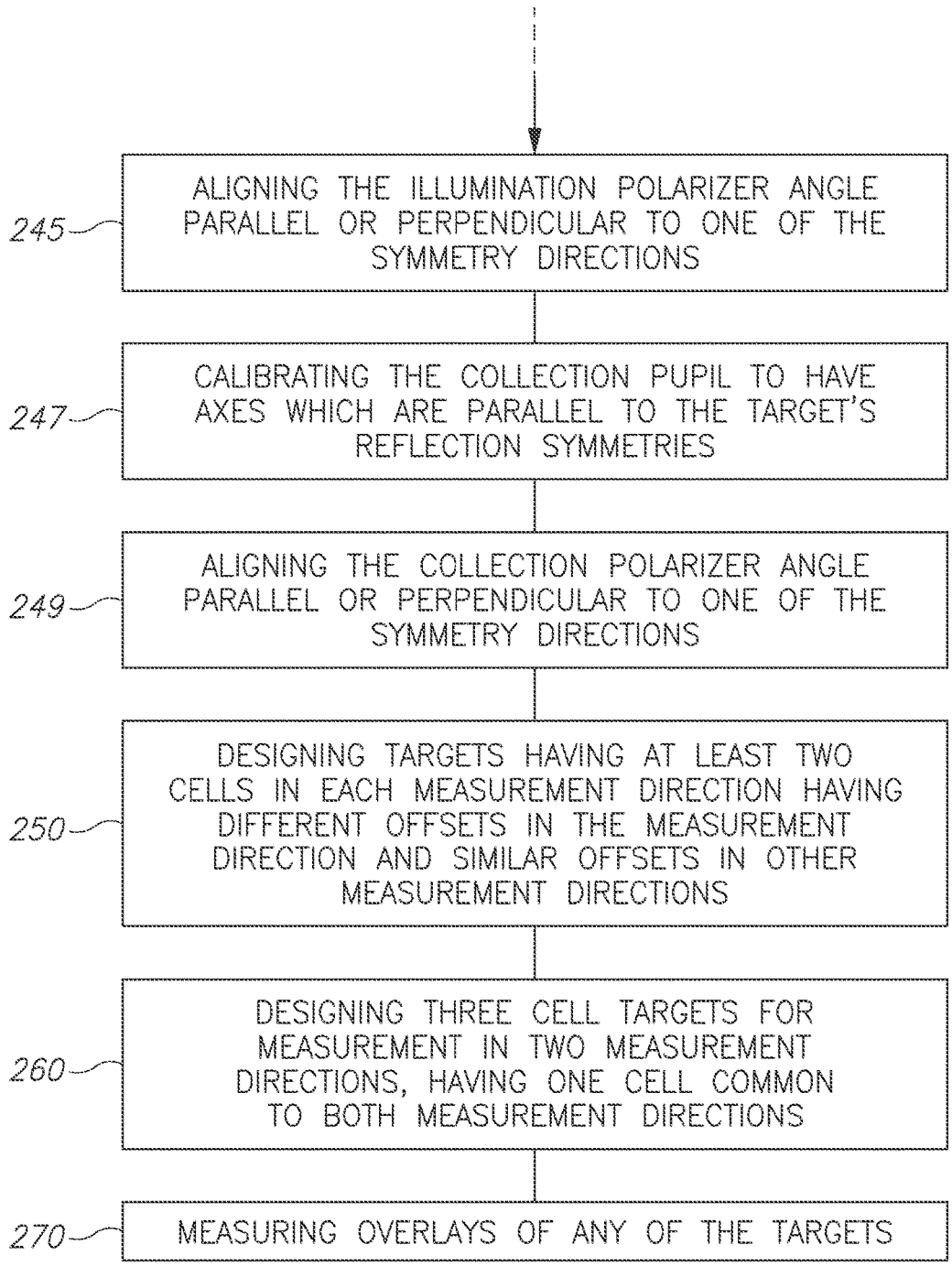
Figure 6 (cont. 1)

REFLECTION SYMMETRIC SCATTEROMETRY OVERLAY TARGETS AND METHODS

CROSS REFERENCE TO RELATED APPLICATIONS

This application is filed under 35 U.S.C. § 111(a) and § 365(c) as a continuation of International Patent Application No. PCT/US2014/048203, filed Jul. 25, 2014, which application claims the benefit of U.S. Provisional Patent Application No. 61/858,613 filed on Jul. 26, 2013, which applications are incorporated herein by reference in their entireties.

BACKGROUND OF THE INVENTION

1. Technical Field

The present invention generally relates to the field of metrology, and more particularly, to scatterometry overlay measurements.

2. Discussion of Related Art

Current scatterometry targets and measurement procedures are designed to be symmetric under 180° rotations of the targets about a normal to the target. Typical symmetry operations do not flip the chirality of the coordinate system.

FIGS. 1A and 1B are schematic illustrations of prior art targets having a 180° rotational symmetry and the resulting inaccuracies in overlay measurements. FIG. 1A illustrates in a perspective view a target 90 having periodic structures with pitch P and exhibiting an overlay $OVL_x$ between the periodic structures at different layers 91, 92. The resulting measurement signal 95 is shown as spots at the imaging pupil plane (with axes $NA_x$, $NA_y$, NA standing for numerical aperture) which represent zeroth order diffraction image 80 and ±1 first order diffraction images 79, 81. Overlay measurements are derived from pupil points 85 which represent angular diffraction signals. In the illustration in FIG. 1A, where only overlay along the x axis exists, signals 79, 80, 81 are symmetric with respect to the pupil plane axis $NA_x$. However, when the periodic structures of target 90 are segmented along the y direction as illustrated in FIG. 1B (e.g., to improve process compatibility, e.g., with smaller pitch $p_2<p_1$), a new overlay $OVL_y$ is introduced. Prior art targets 90 are designed to be symmetric to 180° rotations (a symmetry, which is denoted $R_\pi$ in the following) due to measurement considerations such as calibration of tool induced shifts which requires rotating the wafers. However, the $R_\pi$ symmetry mixes overlays along the x and y axes, as described in the derivation below (see Equation 3A), and the mixing results in an introduction of an error in the location and forms the diffraction images of the first order, illustrated schematically in FIG. 1B. The breaking of reflection symmetry in the Y direction, which gets mixed with the asymmetry in the X direction, thereby causing an error in the metrology reported overlay, is demonstrated in FIG. 1B to be a result of $OVL_y \neq 0$. In general, however, such a symmetry breaking in the Y direction may be a result of many phenomena like asymmetric printing in the Y direction (e.g., an asymmetrically segmented bar or any asymmetrically designed and/or printed target features) or from light scattered along the Y direction from structures exterior to the metrology target.

SUMMARY OF THE INVENTION

The present invention comprises a method with the steps of designing a reflection-symmetric target and measuring overlays of the target along at least one reflection symmetry direction of the target.

The present invention also comprises a method with the step of calibrating a scatterometry measurement tool with respect to at least one reflection symmetry of a reflection symmetric target The present invention also comprises a method to measure scatterometry overlay using first order scatterometry measurements of the scatterometry target, the target comprising a reflection-symmetric target having at least two cells in each of at least two measurement directions, wherein respective cells have different offsets along one measurement direction and similar offsets along other measurement directions.

The present invention also comprises a method to measure scatterometry overlay using zeroth order scatterometry measurements of the scatterometry target, the target comprising a reflection-symmetric target having at least two cells in each of at least two measurement directions, wherein respective cells have different offsets along one measurement direction and similar offsets along other measurement directions.

The present invention also comprises a scatterometry target with a reflection-symmetric target having at least two cells in each of at least two measurement directions, wherein respective cells have different offsets along one measurement direction and similar offsets along other measurement directions.

The present invention also comprises a scatterometry measurement system with a reflection symmetric illumination, the system calibrated to measure reflection symmetric targets.

The present invention also comprises a metrology tool with an illumination path and a collection path of the tool which are symmetric to reflection symmetries of a target.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1A:
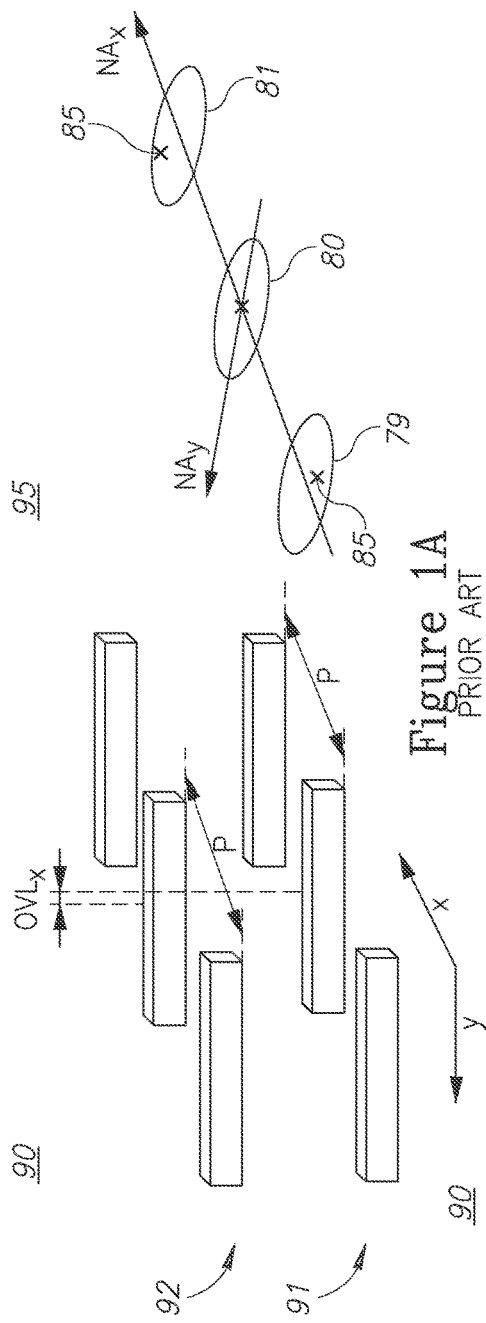
FIG. 1A is a schematic illustration of prior art targets having a 180° rotational symmetry and the resulting inaccuracies in overlay measurements.

Prior to the detailed description being set forth, it may be helpful to set forth definitions of certain terms that will be used hereinafter.

The terms "metrology target", "scatterometry target" or "target" as used herein in this application, are defined as structures designed or produced on a wafer which are used for metrological purposes such as scatterometry overlay (SCOL) measurements. The term "layer" as used herein in this application, is defined as any of the layers used in a photolithography process in any of its steps. The term "cell" as used herein in this application, is defined as a target region which includes target structures at at least one layer, and usually in at least two layers. In general, a target may comprise one, two or more layers, and one, two or more cells. The term "target symmetry" as used herein in this application, is defined as either a (prior art) rotational symmetry of the target about a normal to the target area at the respective target layer or a (presently disclosed) reflection symmetry of the target with respect to a reflection plane ("mirror") perpendicular to the target area at the respective layer.

The term "periodic structure" as used in this application refers to any kind of designed or produced structure in at least one layer which exhibits some periodicity. The periodicity is characterized by its pitch, namely its spatial frequency. Elements of the periodic structure may be segmented, i.e., comprise segments that reduce the size of the minimal target feature. The term "measurement direction" as used in this application refers to the direction along which the periodic structure is periodic. For example, the measurement direction of a grating as the periodic structure is perpendicular to the target elements (e.g., bars or segmented bars) which constitute the grating. Targets may have more than one measurement direction. A common but not limiting disclosed case is of two perpendicular measurement directions denoted as x and y. Usually, but non-limitingly, reflection planes are considered to be perpendicular to the measurement directions.

The term "offset" as used in this application is defined as any breaking of reflection symmetry of a target having at least two periodic structures. Offsets may be designed, e.g., intended deviations between the centers of symmetry of the periodic structures that are used to make unintentional deviations measurable; any structural asymmetries in any target element (e.g., asymmetric elements or element segments); unintended dislocation of the structures, being a source of inaccuracy (i.e., overlay error); related to production parameters and production inaccuracies; or be of non-structural origin and result e.g., from illumination parameters (intended or not intended) or measurement artefacts. The term "overlay" as used in this application refers to measured offsets, and may result from structural offsets or non-structural causes for apparent offsets, such as illumination and process parameters and asymmetries.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The present disclosure introduces new scatterometry overlay (SCOL) technologies and targets which rely on new symmetry characteristics of patterned features such as periodic structures which are used as target layers, namely, symmetry of the target cells with respect to reflections across their x and/or y axes. Instead of SCOL targets and measurement systems which are designed with respect to 180° rotations (about a central axis normal to the target or the wafer) as the prevailing symmetry operation (denoted in the following as $R_\pi$), the present disclosure introduces SCOL targets and respective measurement systems and signals which are designed with respect to reflection symmetries across the target axes (i.e., mirror reflection with respect to mirrors which are perpendicular to the wafer and positioned along the x and y axes of the target or the wafer) as the prevailing symmetry operations (denoted in the following as $T_x$ and $T_y$).

Any asymmetries in the measured signal and the associated errors may be reduced or avoided by the disclosed invention, including asymmetries resulting from any of: designed, e.g., intended deviations between the centers of symmetry of the periodic structures that are used to make unintentional deviations measurable; any structural asymmetries in any target element (e.g., asymmetric elements or element segments); unintended dislocation of the structures, being a source of inaccuracy (i.e., overlay error); related to production parameters and production inaccuracies; or be of non-structural origin and result e.g., from illumination parameters (intended or not intended) or measurement artifacts. All these effects may cause overlay inaccuracy which the new algorithms presented in this invention can reduce.

The present disclosure comprises targets which do not exhibit a 180° rotational symmetry by reflective symmetries ($T_x$ and $T_y$) and thus enable measuring overlays along the x and y axes independently of each other, in a way that prevents the mixing of overlays between the measurement directions. Moreover, reflection symmetric targets enable derivation of overlay measurements from zeroth order diffraction images. The disclosure further comprises target measurement methods, and tool calibration methods which are enabled and benefit from the new target design principles.

Analyzing the transformation properties of Maxwell equations, the inventors have found that under certain assumptions detailed below, the identity expressed in Equation 1 holds for SCOL cells having two-dimensional structures in the X-Y plane (e.g., wire-grid like), composed of units cells in both layers that are symmetric to $T_x$ and $T_y$ by themselves, and printed with relative offsets between the layers in the X and Y direction which are collectively denoted in the following by the vector $\vec{f}=(f_x, f_y)$.

$$I_{det}(\vec{q},\vec{f})=I_{det}(\eta\vec{q},\eta\vec{f}) \qquad \text{Equation 1}$$

with $I_{det}$ being the detected intensity on a pupil plane, $\vec{q}$ being a two-dimensional vector denoting the pixel on the pupil and $\vec{\eta}$ being a vector that characterizes the symmetry transformation of the $\vec{q}$ and $\vec{f}$ vectors, defined as:

$\eta=(+1,+1)$ for the identity transformation;

$\eta=(-1,-1)=\eta_\pi$ for $R_\pi$ (180° rotation);

$\eta=(-1,+1)=\eta_x$ for $T_x$ (reflection with respect to the $x$ axis); and, $\eta=(+1,-1)=\eta_y$ for $T_y$ (reflection with respect to the $y$ axis).

Equation 1 is correct for $\eta=\eta_\pi$ if and only if the individual unit cells of each of the gratings (i.e., the target cells) are symmetric to $R_\pi$ and if the tool is symmetric to rotations by 180°. The mathematical formulation of this statement is that the electric field on pupil coordinate $\vec{K}$ obeys $\vec{E}(-\vec{K})=\pm\vec{E}(\vec{K})$. For example, the plus sign case is obeyed by linear polarizers and analyzers applied to an illumination pupil whose intensity is symmetric to 180° rotations. With the same 180°-symmetric intensity, the minus sign case is obeyed by an azimuthal polarization.

Equation 1 is correct for $\eta=\eta_x$ or for $\eta=\eta_y$ if and only if the individual unit cell of each of the gratings (i.e., the target cells) are symmetric to $T_x$ or $T_y$, respectively, and if the tool is symmetric to the $T_x$ or $T_y$ transformations, respectively. The mathematical formulation of this statement can be shown to mean that illumination intensity is constrained to be symmetric to $T_x$ or $T_y$, respectively, and that the polarizer and analyzer must be set at either 0° or 90° with respect to the X or Y axes of the periodic structures (e.g., gratings), respectively (see Equation 8 below).

Overlay information may be extracted from Equation 1 by defining the following types of signals, in Equations 2A-2C:

$$D_{-1,-1}(\vec{q},\vec{f})=I_{det}(\vec{q},\vec{f})-I_{det}(-\vec{q},\vec{f}) \qquad \text{Equation 2A}$$

$$D_{-1,1}(\vec{q},\vec{f})=I_{det}(q_x,q_y,\vec{f})-I_{det}(-q_x,q_y,\vec{f}) \qquad \text{Equation 2B}$$

$$D_{1,-1}(\vec{q},\vec{f})=I_{det}(q_x,q_y,\vec{f})-I_{det}(q_x,-q_y,\vec{f}) \qquad \text{Equation 2C}$$

Figure 2:
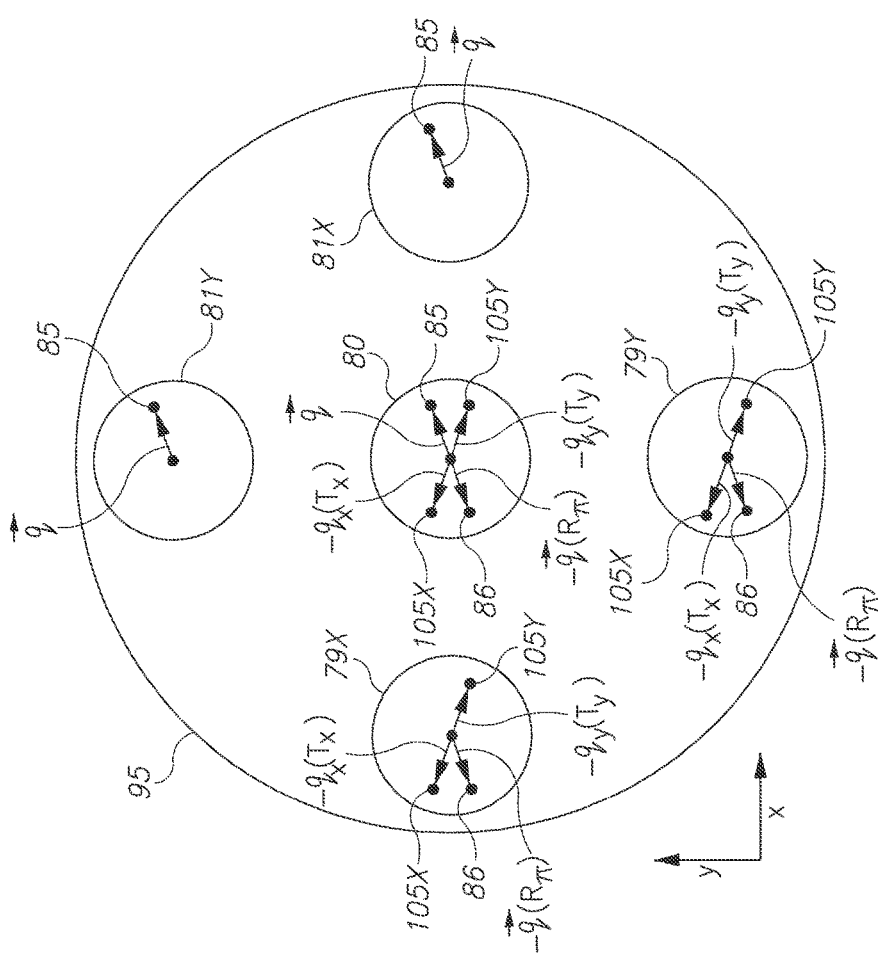
FIG. 2 is a schematic illustration for the locations of the pupil points which are compared when measuring overlay signals, according to some embodiments of the invention.

FIG. 2 schematically illustrates the locations of the pupil points which are compared when measuring each signal D, according to some embodiments of the invention. FIG. 2 schematically illustrated pupil plane 95, zeroth order diffraction image 80 and first order diffraction images along one measurement direction (e.g., x direction, +1 order 81X and −1 order 79X) and along a second, in the non-limiting illustration perpendicular, measurement direction (e.g., y direction, +1 order 81Y and −1 order 79Y).

Prior art methods compare the overlay measured at a point 85 located at 4 in respective image 81X with the overlay measured at a point 86 located in image 79X of the opposite order at location $-\vec{q}$ which represents the position of point 85, rotated through 180° about a central normal axis, i.e., after undergoing the $R_\pi$ transformation –yielding signal $D_{-1,-1}(\vec{q}, \vec{f})$ (Equation 2A). Similar measurements apply respectively to points in images 81Y, 79Y.

In contrast, the disclosed invention compares the overlay at point 85 with overlays at point 105, located at a position which is a reflection of the position of point 85 with respect to a normal plane going through the x or the y axes. Specifically, point 85 in image 81X is reflected ($T_x$) with respect to a normal plane going through the x axis to point 105 in image 79X having $-q_x$ for x coordinate and $q_y$ for y coordinate to measure signal $D_{-1,1}(\vec{q}, \vec{f})$, and point 85 in image 81Y is reflected ($T_y$) with respect to a normal plane going through the y axis to point 105 in image 79Y having $q_x$ for x coordinate and $-q_y$ for y coordinate to measure signal $D_{1,-1}(\vec{q}, \vec{f})$.

In certain embodiments, overlay measurements and illumination calibration may be carried out in zeroth order image 80 at the pupil plane by comparing overlays at point 85 with overlay at points 105X and/or 105Y, each being the respective reflections ($T_x$, $T_y$) thereof and having coordinates $(-q_x, q_y)$ and $(q_x, -q_y)$, respectively. The derivation and steps of zeroth order overlay measurements and illumination calibration using reflection symmetric targets are presented in detail below (Equations 4-7).

Combining Equation 1 with Equations 2A, 2B, and 2C, the following conclusions are reached (respectively):

(i) $D_{-1,-1}$ is an odd function of the vector $\vec{f}$, and flips sign if and only if both $f_x$ and $f_y$ flip sign.

(ii) $D_{-1,1}$ is an odd function of the vector $f_x$ alone, so that $D_{-1,1}$ flips sign if $f_x$ flips sign.

(iii) $D_{1,-1}$ is an odd function of the vector $f_y$ alone, so that $D_{1,-1}$ flips sign if $f_y$ flips sign.

Hence, (ii) and (iii) show that using $T_x$ and $T_y$ symmetries decouples the x and y information regarding the signal response to respective x axis offsets $f_{0x}$ and y axis offsets $f_{0y}$. This result contrast the prior art, which inevitably mixes overlay measurements from both x and y axes.

The disclosed invention comprises targets which exhibit reflection symmetries (e.g., $T_x$, $T_y$) rather than the commonly used rotation symmetry R.

As an additional result, the following discloses new tool calibrations to correspond with newly defined signal asymmetries and the corresponding overlay algorithms and targets, focusing on symmetry breaking with respect to x and y mirror reflection symmetry $T_x$ and $T_y$. The tool calibrations thus enable overlay measurements of signals $D_{-1,1}$ and $D_{1,-1}$ defined in Equations 2B and 2C. Tool calibration may comprise any of the following: (i) Making the illumination and collection path within the tool symmetric to X and/or Y mirror reflection symmetry, (ii) making the intensity in the illumination pupil symmetric to an X and/or Y mirror reflection symmetry, (iii) making the illumination polarizer angle aligned at an angle of either 0° (parallel) or 90° (perpendicular) relative to the X axis or any other axis of the target, (iv) adjusting the collection pupil calibration so that the X and Y axes of the target have corresponding parallel axes which are accurately identified on the pupil (so that the pixels from which one defines $D_{-1,1}$ and $D_{1,-1}$ are accurately identified), and (v) making the collection polarizer angle aligned at an angle of either 0° (parallel) or 90° (perpendicular) relative to the X axis of the target or any other axis of the target.

Reflection Symmetric Targets

The present disclosure comprises scatterometry targets comprising reflection-symmetric targets having at least two cells in each of at least two measurement directions, wherein respective cells have different offsets along one measurement direction and similar offsets along other measurement directions. The scatterometry target may comprise at least three cells for measurement in two measurement directions, having one cell common to both measurement directions. The two measurement directions may be perpendicular and/or the different offsets may be opposite. In all disclosed targets, the offsets may be optimized to minimize algorithmic inaccuracy. The present disclosure further comprises zeroth and/or first order scatterometry measurements of the disclosed scatterometry targets. Furthermore, the present disclosure further comprises measurement systems with symmetrized and calibrated illumination according to the disclosed reflection symmetries.

Figure 3:
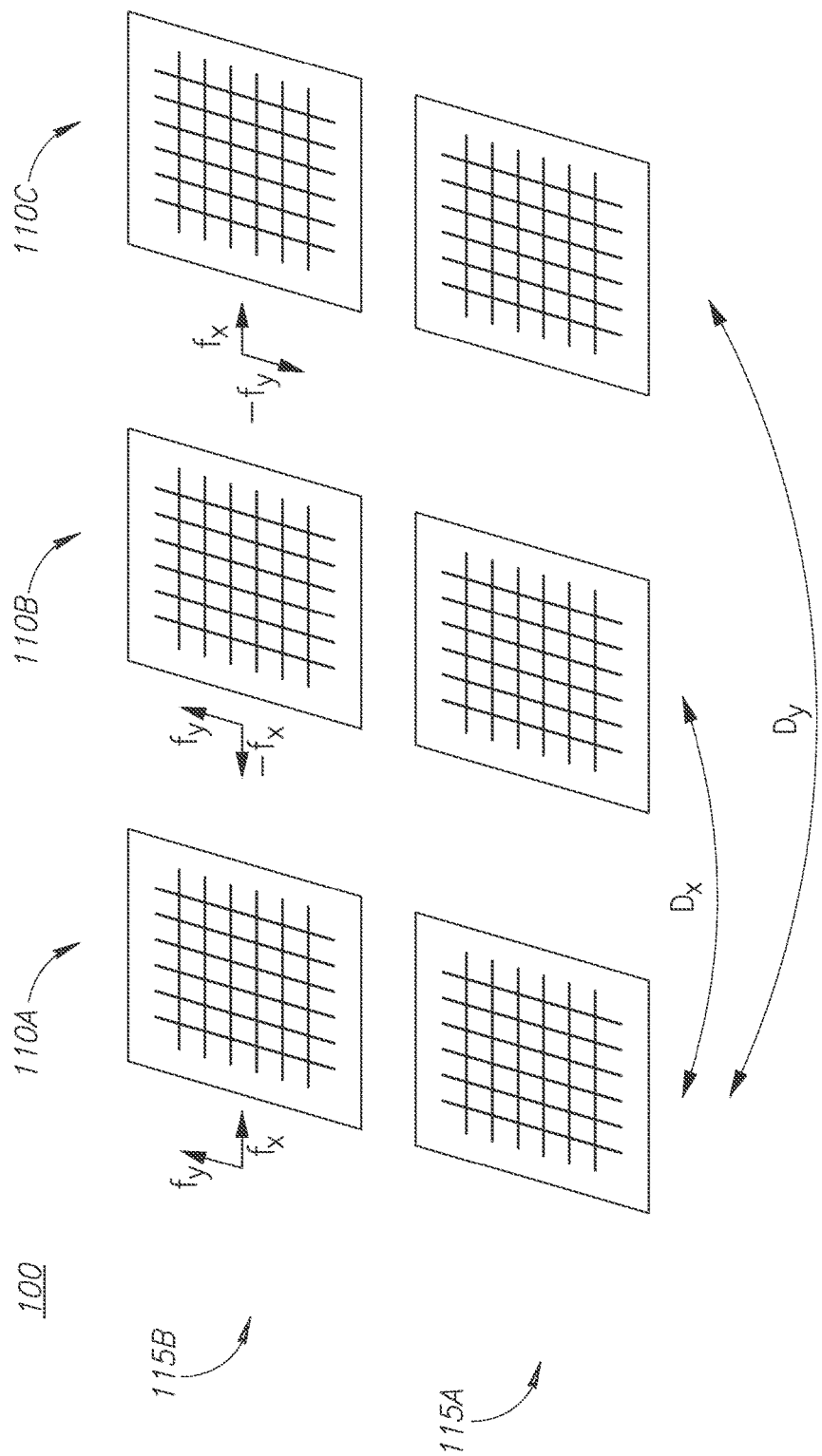
FIG. 3 is a high level schematic illustration of a target, according to some embodiments of the invention.

FIG. 3 is a high level schematic illustration of a target 100, according to some embodiments of the invention. Targets 100 exemplify the possibility to derive overlays at different directions independently from each other. The non-limiting examples relate to x and y as the reflection symmetry directions. Decoupling the X and Y asymmetry information of the cells allows us to extract the overlay in both the X and Y directions with no inaccuracy penalty, using the differential signals $D_{-1,1}$ and $D_{1,-1}$ defined in Equations 2A and 2B.

Figures 4A, 4B:
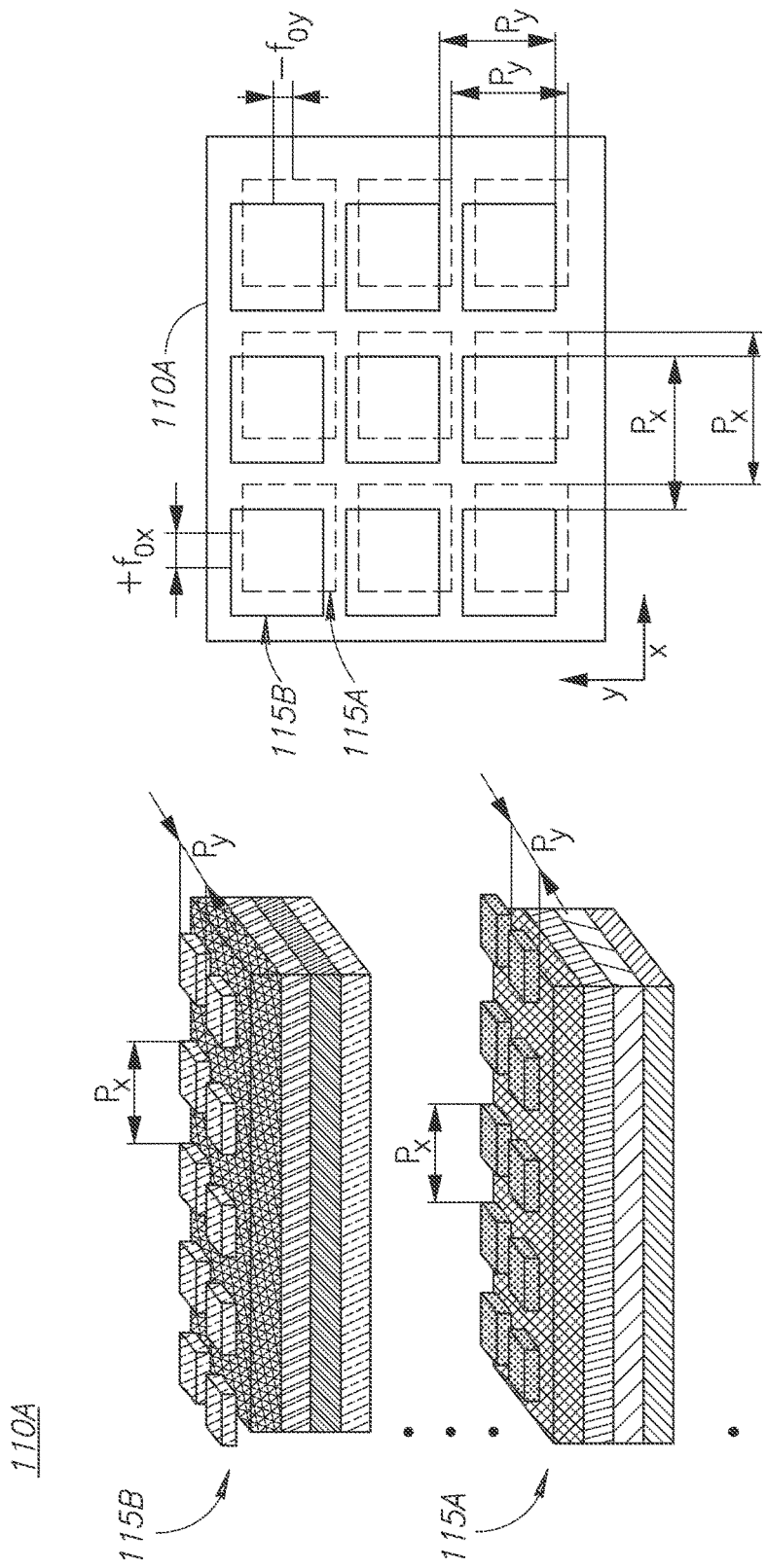
FIG. 4A is a high level schematic illustration of exemplary 3D target cells having periodic structures in two directions, according to some embodiments of the invention.
FIG. 4B is a high level schematic illustration of exemplary 3D target cells having periodic structures in two directions, according to some embodiments of the invention.

Specifically, referring to cells 110A-C in target 100 illustrated in FIG. 3, target layers 115A, 115B may be designed at three dimensions (3D), i.e., have periodic structure with reflection symmetry along both x and y directions (the third dimension is the vertical z direction). FIGS. 4A, 4B are high level schematic illustrations of exemplary 3D target cells having periodic structures in two directions, according to some embodiments of the invention. FIG. 4A is a schematic perspective view while FIG. 4B is a schematic top view of the target cell. Exemplary dimensions are pitches of 600 nm and critical element dimensions (CD) of 300 nm. Pitch and CD values may generally be several hundred nanometers. It is noted that target cell layers are illustrated in FIG. 3 schematically as having periodic structures in two directions, represented by a grid made of two groups of parallel lines along different directions. The target layers may be implemented as the target cell structure represented in FIGS. 4A, 4B or implemented by other structures having two measurement directions.

FIG. 3 schematically illustrates target 100 comprising three cells 110A, 110B, 110C. The overlays in the cells are designed as $\vec{f}_{0,1}=(+f_x, +f_y)$ in cell 110A (marked $+f_x$, $+f_y$ in the illustration), $\vec{f}_{0,2}=(-f_x, +f_y)$ in cell 110B (marked $-f_x$ in the illustration) and $\vec{f}_{0,1}=(+f_x, -f_y)$ in cell 110C (marked $-f_y$ in the illustration). The offset $f_x$, $f_y$ may be different from each other or equal. Moreover, the change in $f_x$ may be a value change of $f_x$, not necessarily a sign reversal, as illustrated non-limitingly in the figures. That is, the three cells may be characterized by the offsets $(f_x, f_y)$, $(f_x+d_x, f_y)$, $(f_x, f_y+d_y)$ with arbitrary $d_x$, $d_y$. Differential signal $D_x=D_{-1,1}$ is measured from cells 110A, 110B to extract the overlay in the X direction and differential signal $D_y=D_{1,-1}$ is measured from cells 110A, 110C to extract the overlay in the Y direction. Cell 110A may thus be used as a reference cell having offsets in both directions, with respect to which two (or more) cells 110B, 110C having different offsets along the respective two directions (x, y) with respect to reference cell, each cell having the same offset along the other direction(s) (y, x, respectively) which are measured.

It is noted that two cells having both two layers, with periodic structures in two directions in each layer of each cell, are probably not useful for calculating the overlays in both directions independently. Defining $\vec{f}_{0,1}=(f_0, f_0)$ and $\vec{f}_{0,2}=(-f_0, -f_0)$, the calculation of the overlay vector $(\Delta_x, \Delta_y)$ from the set of four expressions $$D_{x/y,cells1/2}(\vec{q}) = \sin\left(\frac{2\pi(\Delta_{x/y} \pm f_0)}{P}\right) \times H_{x/y}(\Delta_{y/x} \pm f_0, \vec{q})$$

with x/y denoting alternating x and y, with ± denoting + for cell 1 and − for cell 2 and H being a function determined by the electro-magnetic reflection from the wafer (compare to Equations 3A-3C which are explained below in detail). However, the possibility to calculate the overlay vector from these expressions depends on the unrealistic assumption that $H_{x/y}$ is independent of the offsets in the perpendicular direction y/x respectively, since the overlay algorithm assumes that the prefactor of the sine, whose role is played by the function H in the explanation above, is the same for cell 1 and cell 2.

FIGS. 4A and 4B schematically illustrate periodic structures in two measurement directions, schematically denoted x and y, in two layers 115A, 115B of target cell 110A, as illustrated e.g., in cell 110A in FIG. 3. The structures have two pitches $p_x$, $p_y$ in the respective directions and exhibit in a non-limiting manner overlays $-f_{0x}$ and $+f_{0y}$ between layers 115A, 115B. It is noted that the notations $f_{0x}$, $f_x$, $f_0$ are used in the document interchangeably, as are $f_{0y}$, $f_y$, $f_0$.

Without being bound by theory, the following explains the reason for the higher accuracy of the suggested targets and methods, which analyze separate overlays along the distinct measurement directions, over the prior art which uses 180° rotation symmetric targets and tool calibration. Starting from Equations 2A-2C, it is noted that while $D_\pi=D_{-1,-1}$ is an odd function of $\vec{f}$, $D_x=D_{-1,1}$ and $D_y=D_{1,-1}$ are odd functions of $f_x$ and $f_y$, respectively. The signals may thus be expressed as in Equations 3A-3C (P being the target pitch):

$$D_{-1,-1}(\vec{q}, \vec{f}) = \sum_{\vec{m}} A_{(-1,1),m}(\vec{q})\sin\left(\frac{2\pi\vec{m}\cdot\vec{f}}{P}\right) \qquad \text{Equation 3A}$$

$$D_{-1,1}(\vec{q}, \vec{f}) = \sum_{m_x} A_{(-1,1),m_x}(\vec{q}, f_y)\sin\left(\frac{2\pi m_x f_x}{P}\right) \qquad \text{Equation 3B}$$

$$D_{1,-1}(\vec{q}, \vec{f}) = \sum_{m_y} A_{(1,-1),m_y}(\vec{q}, f_x)\sin\left(\frac{2\pi m_y f_y}{P}\right) \qquad \text{Equation 3C}$$

It is clear from Equation 3A that $D_\pi=D_{-1,-1}$ mixes overlays along different measurement directions, as e.g., both x and y components of $\vec{f}$ are included in the signal. In contrast, signals $D_x=D_{-1,1}$ and $D_y=D_{1,-1}$ (Equations 3B, 3C) only involve offsets in the respective measurement direction x, y, respectively, so that offsets along the y measurement direction do not enter the signal measured along the x measurement direction and offsets along the x measurement direction do not enter the signal measured along the y measurement direction. This difference in mixing the overlays along the measurement directions is illustrated experimentally in FIGS. 5A, 5B below.

Figure 1B:
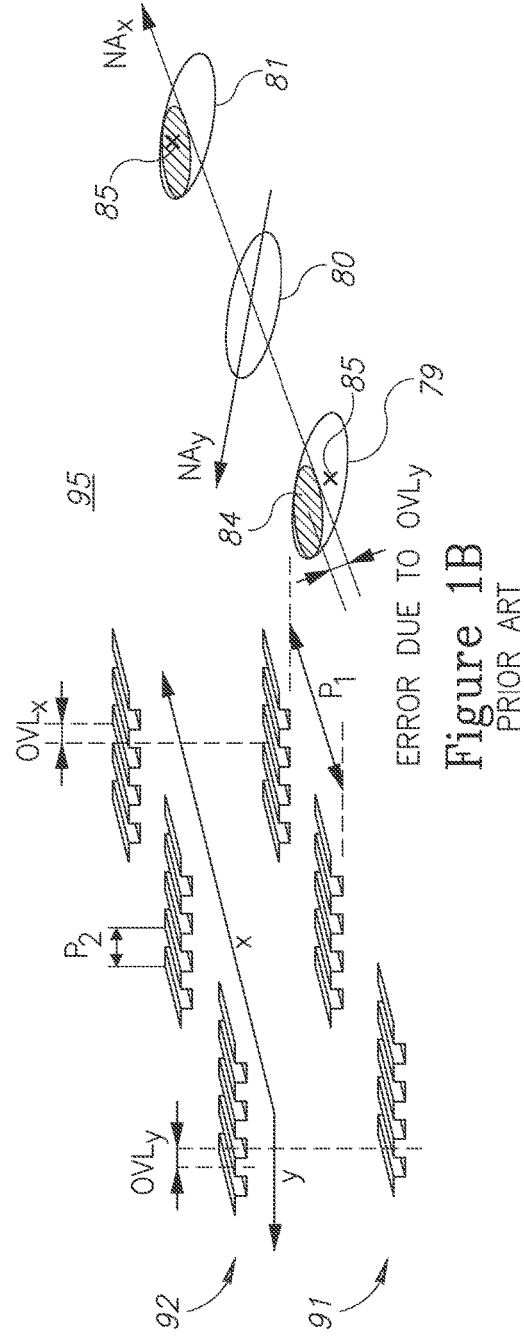
FIG. 1B is a schematic illustration of prior art targets having a 180° rotational symmetry and the resulting inaccuracies in overlay measurements.

The inventors came to the conclusion that the reciprocal influence of overlays between measurement directions can lead to significant inaccuracy penalty, e.g., in the following cases: (i) cells with symmetry breakdown along the y axis (breaking of $T_y$) when measuring the overlay along the X direction with $D_{-1,-1}$ (see FIGS. 5A, 5B below) and cells with symmetry breakdown along the x axis (breaking of $T_x$) when measuring the overlay along the y direction with $D_{-1,-1}$. (ii) cells with periodic structures which are segmented in a direction different than the measurement direction (as e.g., in FIG. 1B), particularly if the segmentation is offset between cell layers. (iii) Any other symmetry breaking of the SCOL cell with respect to $T_y$ or $T_x$ produces an inaccuracy in the measurements of the x or y overlay using $D_{-1,-1}$, respectively.

Beyond reducing the inaccuracy when using the disclosed targets and methods, the inventors have also found out that using targets with three cells, as illustrated e.g., in FIG. 3, indeed results in overlay accuracy and sensitivity which are at the same level of performance or exhibit higher performance than that obtained with the usual four cell targets, as expected from the analysis.

Figure 5B:
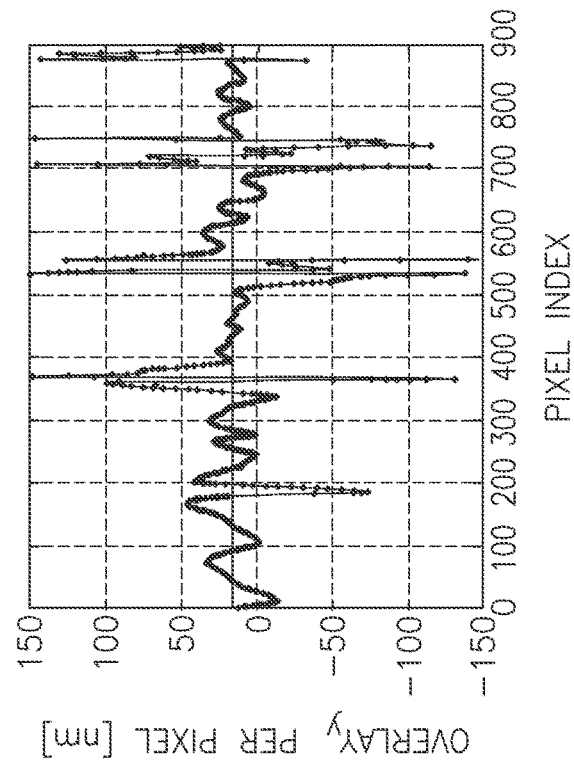
FIG. 5B is a graphical representation for exemplary simulation results of inaccuracies in certain embodiments of the invention; and, FIG. 6 is a high level schematic flowchart illustrating a method, according to some embodiments of the invention.
Figure 5A:
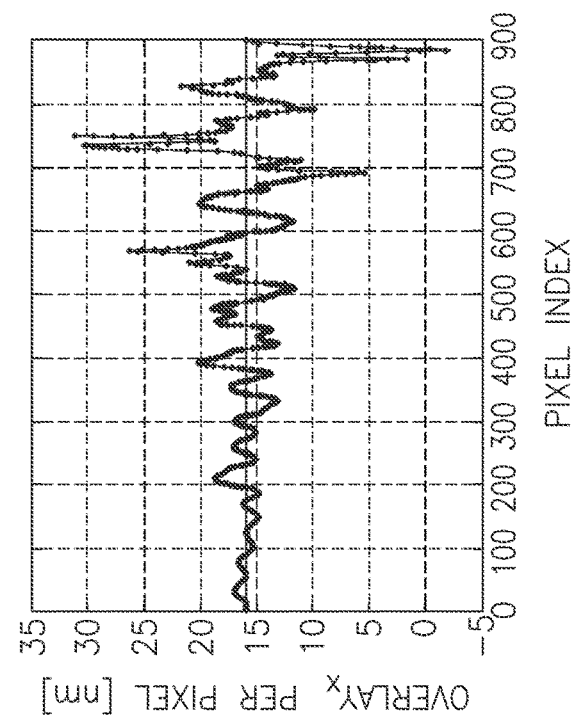
FIG. 5A is a graphical representation for exemplary simulation results of inaccuracies in certain embodiments of the invention.

FIGS. 5A and 5B are exemplary simulation results of inaccuracies in certain embodiments of the proposed invention. The simulations were run with $\lambda$=405 nm, 600 nm pitches of the periodic structures and x and y overlays ($f_{0x}$, $f_{0y}$) of 16 nm. The X axis in these plots is a linearization of the pixel index. As is clear from FIG. 5A, while $D_x=D_{-1,1}$ yielded the correct overlay (16 nm) with no inaccuracy, $D_\pi=D_{-1,-1}$ yielded strongly fluctuating results within the range of ca. 30 nm which is double the actual offset value. It is noted that the fluctuations result from the mixing of the overlay values in the x and y directions due to the 180° rotational symmetry of the targets, as explained above (Equation 3A). Hence, the disclosed invention allows reducing target size from four cell targets to three cell targets, reducing the real estate of SCOL targets by 25% with no accuracy and precision penalty.

The simulation results presented in FIG. 5B further illustrate the elimination by the disclosed invention of the influence of inaccuracies from overlays which are perpendicular to the measurements axis. Specifically, FIG. 5B illustrates the overlay in the x direction (set as before at $f_{0x}$=16 nm) with an offset at the y direction of $f_{0y}$=75 nm. Again $D_x=D_{-1,1}$ yielded the correct overlay (16 nm) with no inaccuracy, while the fluctuations of $D_\pi=D_{-1,-1}$ strongly increase with the larger $f_{0y}$, reaching a range of ca. 300 nm.

Zeroth Order Measurements and Calibration

The inventors have also found that avoiding the mixing of measurement directions by $R_\pi$-symmetric targets, by replacing them with $T_x$- and $T_y$-symmetric targets, enables overlay measurements using the zeroth order SCOL signals, instead of, or in addition to, the practiced overlay measurements from the first order SCOL signals. This result is due to the different effect of the reciprocity theorem on targets with different kinds of symmetries.

Without being bound to theory, and assuming equal and opposite polarizer and analyzer angles (+γ and −γ, respectively), reciprocity dictates that $I(\vec{q}, \vec{f})=I(\vec{q}, -\vec{f})$ and that $I(\vec{q}, \vec{f})=I(-\vec{q}, \vec{f})$. As the signal is a periodic function of $\vec{f}$, it can be expressed as following (Equation 4), with $B_m(\vec{q})=B_m(-\vec{q})$ as the reciprocity condition:

$$I(\vec{q}, \vec{f}) = \sum_{\vec{m}} B_m(\vec{q})\cos\left(\frac{2\pi \vec{m} \cdot \vec{f}}{P}\right) = \quad \text{Equation 4}$$

$$\sum_{\vec{m}} B_m(\vec{q})\cos\left(\frac{2\pi m_x f_x}{P}\right)\cos\left(\frac{2\pi m_y f_y}{P}\right) - $$

$$\sum_{\vec{m}} B_m(\vec{q})\sin\left(\frac{2\pi m_x f_x}{P}\right)\sin\left(\frac{2\pi m_y f_y}{P}\right)$$

Calculating the different differential signals and using Equation 1 we get that the measurement signal at the zeroth order can be expressed as (Equation 5):

$$D_{\vec{\eta}}(\vec{q}, \vec{f}) \equiv I(\vec{q}, \vec{f}) - I(\eta\vec{q}, \vec{f}) = \quad \text{Equation 5}$$

$$I(\vec{q}, \vec{f}) - I(\vec{q}, \eta\vec{f}) = \sum_{\vec{m}} B_m(\vec{q})\left[\sin\left(\frac{2\pi m_x f_x}{P}\right)\sin\left(\frac{2\pi m_y f_y}{P}\right) - \right.$$

$$\left. \sin\left(\frac{2\pi \eta_x m_x f_x}{P}\right)\sin\left(\frac{2\pi \eta_y m_y f_y}{P}\right)\right]$$

$$= \sum_{\vec{m}} B_m(\vec{q})(1-\eta_x\eta_y)$$

$$\sin\left(\frac{2\pi m_x f_x}{P}\right)\sin\left(\frac{2\pi m_y f_y}{P}\right).$$

Equation 5 means that:

$$D_{-1,-1}(\vec{q}, \vec{f}) = 0 \quad \text{Equation 6A}$$

$$D_{-1,-1}(\vec{q}, \vec{f}) = \quad \text{Equation 6B}$$

$$D_{1,-1}(\vec{q}, \vec{f}) = 2\sum_{\vec{m}} B_m(\vec{q})\sin\left(\frac{2\pi m_x f_x}{P}\right)\sin\left(\frac{2\pi m_y f_y}{P}\right)$$

And so that (Equation 7):

$$D_x = \quad \text{Equation 7}$$

$$D_y = \sum_{m_x} \tilde{B}_{m_x}^{(x)}(\vec{q}, f_y)\sin\left(\frac{2\pi m_x f_x}{P}\right) = \sum_{m_y} \tilde{B}_{m_y}^{(y)}(\vec{q}, f_x)\sin\left(\frac{2\pi m_y f_y}{P}\right)$$

As $B^{(x)}(\vec{q}, f_y=0)=B^{(y)}(\vec{q}, f_x=0)=0$ both $D_x$ and $D_y$ can be extracted from two zeroth order overlay measurements when $f_x$ and $f_y$ are ≠0, P/2, P etc., e.g., with $f_x=f_y=P/4$.

Hence, using reflection symmetric targets and measurement algorithms allows measuring overlay using zeroth order diffraction measurements, which are impossible using current technology (due to Equation 6A).

Illumination System Calibration

Coming back to the configuration of the optical system, the inventors have shown that the Jones matrix of the analyzer at the collection, whose polarization angle is y', changes under the reflection and\or rotation transformations as (Equation 8):

$$J(\vec{q}) \to J(\vec{q}) = \begin{pmatrix} \eta_x^2\cos^2\gamma' & \eta_x\eta_y\cos\gamma'\sin\gamma' \\ \eta_x\eta_y\cos\gamma'\sin\gamma' & \eta_y^2\sin^2\gamma' \end{pmatrix} \quad \text{Equation 8}$$

For $R_\pi$ symmetric targets (with $\vec{\eta}=(-1,-1)$), Equation 8 Means that, for any γ', the Jones matrix is invariant and so that the analyzer is not breaking the symmetry. However, for $T_x$ and $T_y$ symmetric targets (with $\eta_x=\pm\eta_y$), the Jones matrix will be invariant only if cos γ' sin γ'=0, i.e. γ' must be equal to 0 or 90° to prevent tool induced shift.

Certain embodiments comprise a metrology tool comprising an illumination path and a collection path of the tool which are symmetric to reflection symmetries of a target. In the metrology tool, a collection pupil is calibrated to have axes which are parallel to the target's reflection symmetries. Target illumination may be calibrated with respect to the reflection symmetry. Intensity at an illumination pupil may be adjusted to be symmetric to the target's reflection symmetries. An illumination polarizer angle may be aligned to be parallel or perpendicular to one of the symmetry directions. A collection polarizer angle may be aligned to be parallel or perpendicular to one of the symmetry directions.

Figure 6:
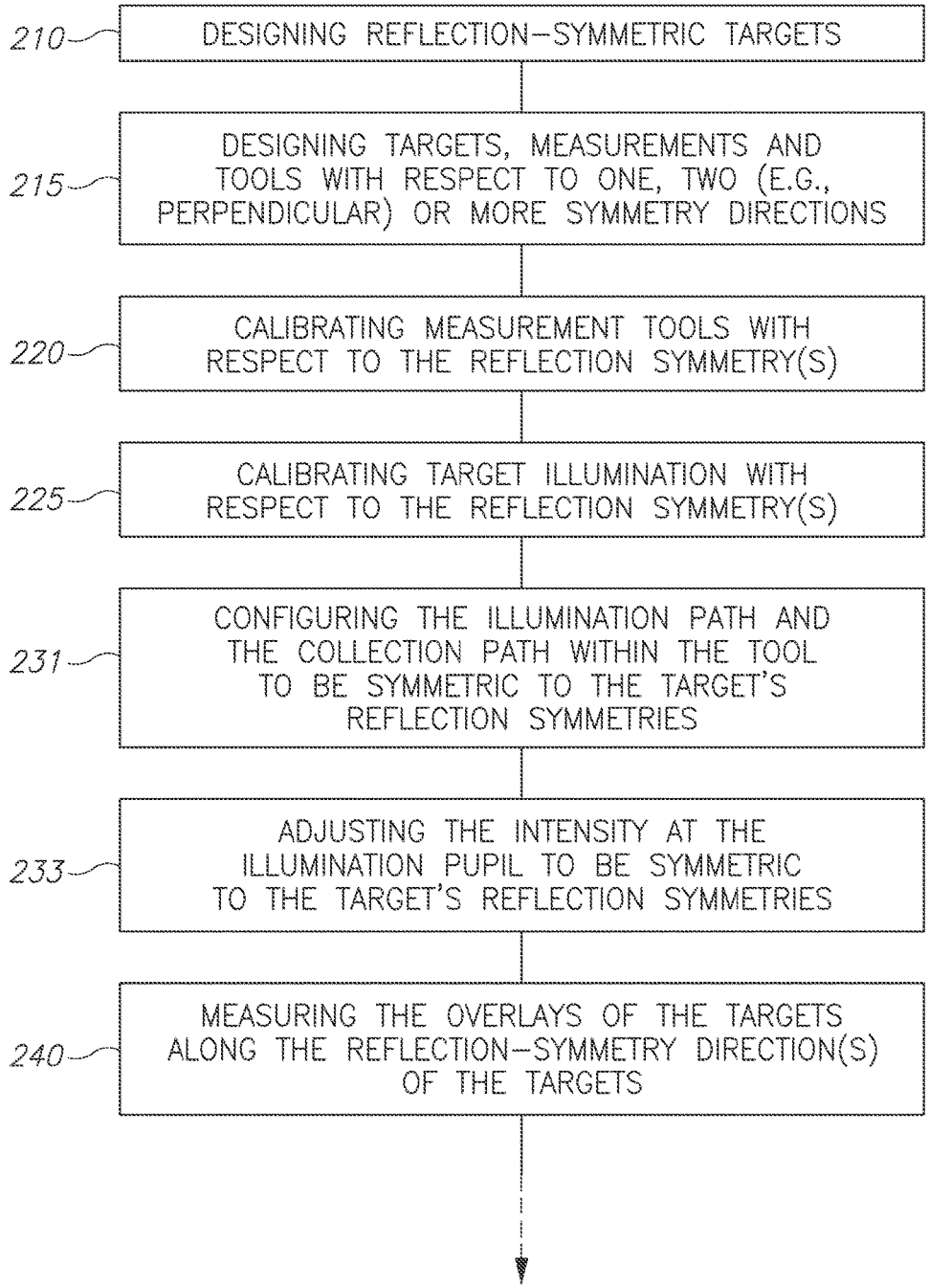

FIG. 6 is a high level schematic flowchart illustrating a method 200 according to some embodiments of the invention. Any of the method stages may be carried out by at least one processor. The disclosure further comprises a computer program product comprising a computer readable storage medium having computer readable program embodied therewith, the computer readable program configured to carry out any stage of method 200.

Method 200 comprises designing reflection-symmetric targets (stage 210) and measuring overlays of the targets along the reflection-symmetry direction(s) thereof (stage 240). Specifically, overlays may be measured between two or more cells having different offsets along one measurement direction and similar offsets along other, e.g., perpendicular direction(s).

Method 200 may further comprise calibrating measurement tools with respect to the reflection symmetry (stage 220) and/or calibrating target illumination with respect to the reflection symmetry (stage 225).

Method 200 may comprise any of: configuring the illumination path and the collection path within the tool to be symmetric to the target's reflection symmetries (stage 231), adjusting the intensity at the illumination pupil symmetric to the target's reflection symmetries (stage 233), aligning the illumination polarizer angle parallel or perpendicular to one of the symmetry directions (stage 245), calibrating the collection pupil to have axes which are parallel to the target's reflection symmetries (stage 247) and aligning the collection polarizer angle parallel or perpendicular to one of the symmetry directions (stage 249).

Targets, measurements and tools may be designed with respect to one, two or more symmetry directions, and two symmetry directions may be perpendicular (stage 215).

Method 200 may comprise designing targets having at least two cells in each measurement direction having different offsets in the measurement direction and similar offsets in other measurement directions (stage 250); designing three cell targets for measurement in two measurement directions, having one cell common to both measurement directions (stage 260) and/or measuring overlays of any of the targets (stage 270).

Advantageously, the disclosed invention is superior to current scatterometry overlay technologies which are designed with respect to planar 180° rotations ($R_\pi$) about their center of symmetry axis (an axis which is perpendicular to the wafer). While $R_\pi$-based technologies require two separate SCOL targets to measure offsets in two perpendicular measurement directions (x, y), resulting in SCOL targets having four cells, the present invention enables using only three cells to measure both directions reliably. Furthermore, while $R_\pi$-based technologies have inherent inaccuracy due to the mixing of overlays from the two perpendicular measurement directions, targets disclosed in the present invention efficiently separate measurements in each directions, and are hence more accurate. Finally, while current technologies require SCOL measurements using the first diffraction orders, the present invention provides nonzero SCOL measurements using the zeroth order diffraction signal.

Advantageously, the present disclosure includes a novel approach to SCOL, which replaces the central role of $R_\pi$ by two different symmetries denoted by $T_x$ and $T_y$ that represent mirror reflections across the x and y axes of the target, respectively. As $T_x$ and $T_y$ flip the chirality of the coordinate system while $R_\pi$ does not, the disclosed symmetries lead to new SCOL algorithms that cannot be mimicked by the conventional ones. The novel approach solves the inaccuracy problems of present methods and eliminates the following restrictions which apply to prior art technologies: (i) the need for separate SCOL targets to measure the overlay in the x and y directions which implies using at least four target cells, (ii) inaccuracies introduced by segmentation of elements of the target's periodic structures and\or any symmetry breakdown of the reflections across the direction perpendicular to the overlay measurement direction; and enables overlay measurements with zeroth order diffracted light and four cells by defining the differential signal as a subtraction between pupil points) which is not possible when using $R_\pi$ symmetric targets. Respective illumination and calibration configurations for the novel approach are presented.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A system comprising:
   a memory element configured to store a set of computer-readable instructions; and
   one or more processors communicatively coupled to an overlay scatterometry metrology tool and configured to execute the set of computer-readable instructions, wherein the set of computer-readable instructions are configured to cause the one or more processors to:

receive, from an overlay scatterometry metrology tool calibrated to provide illumination in a sample plane that is reflection symmetric along a first direction and a second direction perpendicular to the first direction, scatterometry measurements associated with a sample including three or more target cells designed for reflection-symmetric overlay determination, wherein a pupil plane of the overlay scatterometry metrology tool is calibrated to have a first pupil axis corresponding to the first direction and a second pupil axis corresponding to the second direction, wherein each of the three or more target cells include first-layer features in a first layer of the sample periodically distributed along the first and second directions and positioned to be reflection symmetric along the first and second directions, wherein each of the three or more target cells include second-layer features in a second layer of the sample periodically distributed along the first and second directions and positioned to be reflection symmetric along the first and second directions, wherein a first pair of target cells of the three or more target cells include first-layer features offset from the second layer features by a common offset in the second direction and known different offsets in the first direction, wherein a second pair of target cells of the three or more target cells include first layer-features offset from the second layer features by a common offset in the first direction and known different offsets in the second direction;

determine, upon receipt of the scatterometry measurements associated with the sample including the three or more target cells designed for reflection-symmetric overlay determination, overlay along the first direction based on differential signals for target cells in the first pair of target cells based on subtraction of pupil points symmetrically located around the second pupil axis and associated with a selected diffraction order along the first direction; and determine, upon receipt of the scatterometry measurements associated with the sample including the three or more target cells designed for reflection-symmetric overlay determination, overlay along the second direction based on differential signals for target cells in the second pair of target cells based on subtraction of pupil points symmetrically located around the first pupil axis and associated with a selected diffraction order along the second direction.

2. A system comprising:

an overlay scatterometry metrology tool, wherein the overlay scatterometry metrology tool is configured to direct illumination to a sample plane, wherein the illumination in the sample plane is reflection symmetric along a first direction and a second direction perpendicular to the first direction, wherein a pupil plane of the overlay scatterometry metrology tool is calibrated to have a first pupil axis corresponding to the first direction and a second pupil axis corresponding to the second direction;

a memory element configured to store a set of computer-readable instructions; and one or more processors communicatively coupled to the overlay scatterometry metrology tool and configured to execute a set of computer-readable instructions, wherein the set of computer-readable instructions are configured to cause the one or more processors to:

receive, from the overlay scatterometry metrology tool, scatterometry measurements associated with a sample including three or more target cells designed for reflection-symmetric overlay determination, wherein each of the three or more target cells include first-layer features in a first layer of the sample periodically distributed along the first and second directions and positioned to be reflection symmetric along the first and second directions, wherein each of the three or more target cells include second-layer features in a second layer of the sample periodically distributed along the first and second directions and positioned to be reflection symmetric along the first and second directions, wherein a first pair of target cells of the three or more target cells include first-layer features offset from the second layer features by a common offset in the second direction and known different offsets in the first direction, wherein a second pair of target cells of the three or more target cells include first layer-features offset from the second layer features by a common offset in the first direction and known different offsets in the second direction;

determine, upon receipt of the scatterometry measurements associated with the sample including the three or more target cells designed for reflection-symmetric overlay determination, overlay along the first direction based on differential signals for each target cell in the first pair of target cells based on subtraction of pupil points symmetrically located around the second pupil axis and associated with a selected diffraction order along the first direction; and determine, upon receipt of the scatterometry measurements associated with the sample including the three or more target cells designed for reflection-symmetric overlay determination, overlay along the second direction based on differential signals for each target cell in the second pair of target cells based on subtraction of pupil points symmetrically located around to the first pupil axis and associated with a selected diffraction order along the second direction.

3. The system of claim 1, wherein the three or more target cells comprise:

three target cells.

4. The system of claim 3, wherein the first pair of target cells comprises:

a first target cell; and a second target cell, wherein the first target cell and the second target cell include first-layer features offset from the second layer features by a common offset in the second direction and known different offsets in the first direction.

5. The system of claim 4, wherein the second pair of target cells comprises:

the first target cell; and a third target cell, wherein the first target cell and the third target cell include first-layer features offset from the second layer features by a common offset in the first direction and known different offsets in the second direction.

6. The system of claim 1, wherein the selected diffraction order along the first direction comprises:

a first diffraction order, wherein the differential signals for the target cells in the first pair of target cells are determined based on differential measurements of a +1 diffraction order and a −1 diffraction order along the first direction.

7. The system of claim 6, wherein the differential measurements of the +1 diffraction order and a −1 diffraction order along the first direction are determined based on subtraction of reflectively symmetric portions of the pupil plane with respect to the second pupil axis.

8. The system of claim 1, wherein the selected diffraction order along the second direction comprises:
a first diffraction order, wherein the differential signals for each target cell in the second pair of target cells are determined based on differential measurements of a +1 diffraction order and a −1 diffraction order along the second direction.

9. The system of claim 8, wherein the differential measurements of the +1 diffraction order and the −1 diffraction order along the second direction are determined based on subtraction of reflectively symmetric portions of the pupil plane with respect to the first pupil axis.

10. The system of claim 1, wherein the selected diffraction order along the first direction comprises:
a zeroth diffraction order, wherein the differential signals for each target cell in the first pair of target cells are determined based on reflectively symmetric portions of the pupil plane with respect to the second pupil axis.

11. The system of claim 1, wherein the selected diffraction order along the first direction comprises:
a zeroth diffraction order, wherein the differential signals for each target cell in the first pair of target cells are determined based on reflectively symmetric portions of the pupil plane with respect to the first pupil axis.

12. The system of claim 2, wherein the first pair of target cells comprises:
a first target cell; and
a second target cell, wherein the first target cell and the second target cell include first-layer features offset from the second layer features by a common offset in the second direction and known different offsets in the first direction.

13. The system of claim 12, wherein the second pair of target cells comprises:
the first target cell; and
a third target cell, wherein the first target cell and the third target cell include first-layer features offset from the second layer features by a common offset in the first direction and known different offsets in the second direction.

14. The system of claim 2, wherein the selected diffraction order along the first direction comprises:
a first diffraction order, wherein the differential signals for the target cells in the first pair of target cells are determined based on differential measurements of a +1 diffraction order and a −1 diffraction order in reflectively symmetric portions of the pupil plane with respect to the second pupil axis.

15. The system of claim 2, wherein the selected diffraction order along the second direction comprises:
a first diffraction order, wherein the differential signals for each target cell in the second pair of target cells are determined based on differential measurements of a +1 diffraction order and a −1 diffraction order reflectively symmetric portions of the pupil plane with respect to the first pupil axis.

16. The system of claim 2, wherein the selected diffraction order along the first direction comprises:
a zeroth diffraction order, wherein the differential signals for each target cell in the first pair of target cells are determined based on reflectively symmetric portions of the pupil plane with respect to the second pupil axis.

17. The system of claim 2, wherein the selected diffraction order along the first direction comprises:
a zeroth diffraction order, wherein the differential signals for each target cell in the first pair of target cells are determined based on reflectively symmetric portions of the pupil plane with respect to the first pupil axis.

* * * * *